(12) United States Patent
Carrette et al.

(10) Patent No.: US 10,824,124 B2
(45) Date of Patent: Nov. 3, 2020

(54) SYSTEM AND METHOD FOR HANDLING EQUIPMENT SERVICE FOR MODEL PREDICTIVE CONTROLLERS AND ESTIMATORS

(71) Applicant: SHELL OIL COMPANY, Houston, TX (US)

(72) Inventors: Pierre Christian Marie Carrette, Seria (BN); John Martin Williamson, Houston, TX (US); Jean Valiquette, Houston, TX (US); HengJie Zhou, Houston, TX (US); William Matthew Canney, Fulshear, TX (US)

(73) Assignee: SHELL OIL COMPANY, Houston, TX (US)

( * ) Notice: Subject to any disclaimer, the term of this patent is extended or adjusted under 35 U.S.C. 154(b) by 409 days.

(21) Appl. No.: 15/578,110

(22) PCT Filed: Jun. 2, 2016

(86) PCT No.: PCT/US2016/035468
§ 371 (c)(1),
(2) Date: Nov. 29, 2017

(87) PCT Pub. No.: WO2016/196762
PCT Pub. Date: Dec. 8, 2016

(65) Prior Publication Data
US 2018/0157224 A1  Jun. 7, 2018

Related U.S. Application Data

(60) Provisional application No. 62/171,583, filed on Jun. 5, 2015.

(51) Int. Cl.
*G05B 13/04* (2006.01)
*G06F 30/00* (2020.01)

(52) U.S. Cl.
CPC ......... *G05B 13/042* (2013.01); *G05B 13/048* (2013.01); *G06F 30/00* (2020.01)

(58) Field of Classification Search
None
See application file for complete search history.

(56) References Cited

U.S. PATENT DOCUMENTS 6,952,808 B1 * 10/2005 Jamieson ............. G05B 19/409
715/764
6,973,366 B2   12/2005 Komai
(Continued)

FOREIGN PATENT DOCUMENTS

CN         1864156 A       11/2006

OTHER PUBLICATIONS

International Search Report and Written Opinion received for PCT Patent Application No. PCT/US2016/035468, dated Sep. 2, 2016, 7 pages.

*Primary Examiner* — Cedric Johnson

(57) ABSTRACT

It is advantageous to handle certain conditions when equipment (or equipment components) is taken out-of-service or shutdown for service or maintenance. Equipment service flags may be used to indicate that an individual variable will no longer be propagated as the associated equipment has been taken out of line for service. When multiple variables feed another system or component downstream, those variables may be placed in an equipment service set and that set may be associated with an indicator that indicates that the group of variables in the equipment service set is unavailable. A visual indicator as to which variables have been made unavailable for propagation may be displayed to a user. Once the equipment or system is brought back online or is taken out of equipment service mode, the appropriate (Continued)

flags and equipment service set are reset and associated variables are once again propagated downstream.

13 Claims, 3 Drawing Sheets

(56) References Cited

U.S. PATENT DOCUMENTS

| | | |
|---|---|---|
| 7,698,242 B2 | 4/2010 | Van Camp et al. |
| 9,880,540 B2 * | 1/2018 | Nixon .................... H04L 67/12 |
| 2004/0153437 A1 | 8/2004 | Buchan |
| 2004/0162887 A1 | 8/2004 | Dillon et al. |
| 2006/0042461 A1 * | 3/2006 | Boyden ................ B01D 53/346 95/1 |
| 2007/0208549 A1 * | 9/2007 | Blevins ................. G05B 17/02 703/6 |
| 2009/0125285 A1 * | 5/2009 | Gugaliya ............... G05B 17/02 703/2 |
| 2009/0287319 A1 | 11/2009 | Attarwala |
| 2012/0041570 A1 | 2/2012 | Jones et al. |

* cited by examiner

SYSTEM AND METHOD FOR HANDLING EQUIPMENT SERVICE FOR MODEL PREDICTIVE CONTROLLERS AND ESTIMATORS

PRIORITY CLAIM

The present application is the National Stage (§ 371) of International Application No. PCT/US2016/035468, filed Jun. 2, 2016, which claims priority from U.S. Patent Application No. 62/171,583, filed Jun. 5, 2015 incorporated herein by reference.

TECHNICAL FIELD

The present disclosure relates generally to handling equipment service by utilizing equipment service flags or equipment service sets that allow the control or estimation model designer to prepare for and handle processing equipment mode changes, such as for example, equipment taken out-of-service for short-term maintenance.

BACKGROUND

The present invention relates to a method and process of utilizing equipment service flags or equipment service sets to properly manage predictive control or estimation system models for changes in the operating mode of manufacturing process equipment, for example, equipment being taken out-of-service for short term or temporary maintenance.

It was often the case that discrete pieces of manufacturing process equipment would need to be taken off-line (out-of-service) or temporarily shut-down for physical maintenance or for other purposes. For example, ethylene cracker furnaces may be frequently deactivated or "taken down" for de-coking, coker charge furnaces may be taken down for "spalling" and heat exchangers may be taken out-of-service for "backwashing." Similarly, other equipment may be activated, for example, ethylene cracker furnaces may be added to increase capacity or heat exchangers may be placed in-service to provide additional cooling. In prior systems, when the mode of a modeling component or piece of equipment needed to be changed, the model predictive control or estimation software would have to be deactivated, or specially coded and maintained to manage these conditions. Many other such examples exist in the petrochemical environment as well as other environments.

When the mode of processing equipment must be changed, the expected process effect of certain variables such as disturbance variables (DVs), manipulated variables (MVs), intermediate process output variables (POVs), and other system components known to one of ordinary skill in the art, must have their measurement and model prediction effect adjusted based on these equipment status changes so as to allow an estimator or controller to continue to correctly operate. For example, when an intermediate piece of processing equipment is taken out-of-service, the designer may choose not to propagate forward its predicted process variable effects to variables associated with downstream processing equipment. For example, a heat changer between two distillation columns may be taken out-of-service, such that changes in its temperature measurements no longer produce effect on the measurements associated with the feed of the downstream column. Current model predictive control technologies negate the effects for MVs and DVs by setting an associated service flag to "OFF," but currently do not include a method for negating the effects of intermediate POVs.

The desired design behavior is often to stop the intermediate POV measurement feedback and prediction propagation for select variables or select portions of the model when the mode of the associated processing equipment is changed. Thus, in prior model predictive estimation and control technologies, managing the changes in modeled process effects for one or more process variables in a structured manner would require custom coding and frequently the maintenance of multiple models or programmatic modeling changes. This requirement was costly due to the amount of time to code individual solutions, maintenance of the software and models and mistakes by an operator or user associated with selecting the proper configuration. This was also inefficient because the lack of flexibility associated with this method led to the need to deactivate control and/or estimation applications for the variety of process equipment changes that occurred.

SUMMARY

In accordance with the present disclosure, a system and method is herein disclosed for an equipment service concept that allows the estimation and control application designer to designate individual or groups of variables (as in a service condition) and have their resulting effect on the process model properly adjusted in a structured manner.

In one embodiment for an equipment service concept, a request is received for service of one or more equipment components. The request may be received at an estimator or a controller or any combination thereof. The type of request is determined, wherein the type of comprises equipment service for one or more variables. In one embodiment the type of request may be for an individual variable. In another embodiment the type of request may be for a group of variables, wherein the group of variables forms a set. This set of group of variables may be specifically constructed by a user or a designer to handle certain conditions. One or more flags associated with the variables are set. Next, the variables are adjusted along with the model structure. It is then determined if the equipment service has been completed. Once completed, the one or more flags are reset and the model structure is readjusted to propagate the one or more variables. The one or more internal model predictions are also adjusted. The equipment service flags are reset and the model structure is readjusted to propagate the one or more variables. The internal model predictions may then be adjusted.

In one embodiment, the model structure comprises at least one of setting modeling coefficients to zero to remove process relationships and adjustment of coefficients for more complex modeled process relationships. The model structure may be adjusted, at least in part, for at least one of prediction purposes, calibration of associated process output variable (POV) process measurements, process POV estimation and future prediction, determination of a manipulated variable control adjustments, determination of feasible manipulated variable and control variable target values, and optimization of a process.

In one embodiment a visual indicator, for example, an indicator to a display, may be used to identify the one or more variables that are currently in an equipment service mode. That is, the equipment service flags associated with the one or more variables is set. In one embodiment, one or more input variables not included in a service status change are associated with the one or more equipment components.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

Figure 1:
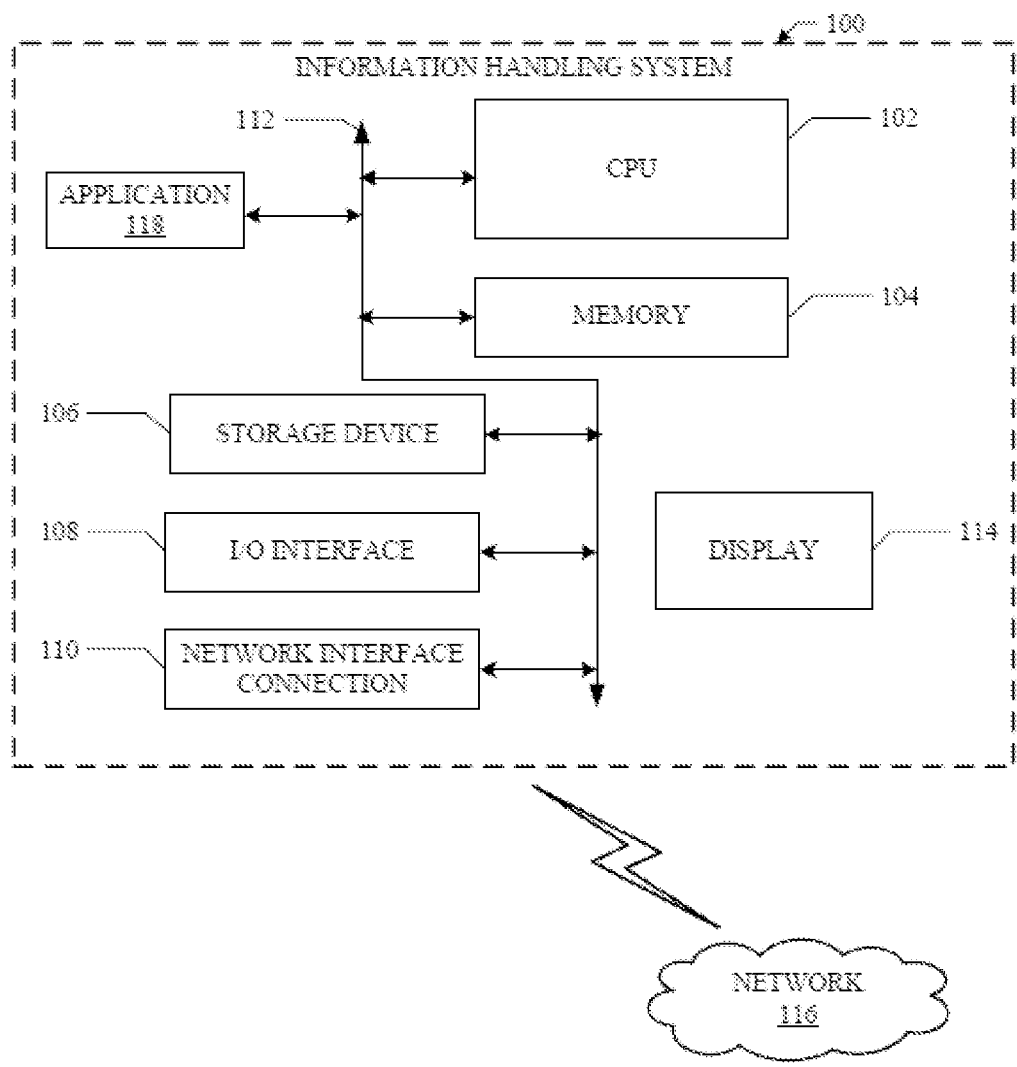
FIG. 1 shows an example information handling system according to one or more embodiments of the present disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

The method and process of using equipment service flags for model predictive estimators and controllers is introduced to provide a convenient way to modify the effect of select variable condition changes on the predicted values of other model related variables. One embodiment may include an estimator, such as for predicting measurements associated with processing equipment for operational purposes such as monitoring, quality control, alarming, or any other operational purposes known to one of ordinary skill in the art, or a process controller. The system bay be used when directly connected to process equipment, known to those skilled in the art as "on-line" or for design computations in an "off-line" condition. An estimator refers to a computational based predictive application designed to estimate actual or potential measurement variables associated with processing equipment, also known to those of skill in the art as a "soft sensor," "inferential measurement," "predictive estimator" or other terms. A controller refers to a multivariable model-based predictive control (MPC) application designed to perform advanced process control (APC). A controller or estimator processor incorporates many functions, including I/O communications, variable and measurement validation, estimation and prediction, steady-state optimization, and control move calculation.

Referring now to the drawings, the details of specific example embodiments are schematically illustrated. Like elements in the drawings will be represented by like numbers, and similar elements will be represented by like numbers with a different lower case letter suffix.

For one or more embodiments of the present invention, an information handling system may be utilized to implement one or more embodiments. Such embodiments may be implemented on virtually any type of information handling system regardless of the platform being used. Such information handling system hardware used to implement one or more of the embodiments described herein may include a processor configured to execute one or more sequences of instructions, programming stances, or code stored on a non-transitory, computer-readable medium. For example, as shown in FIG. 1, an information handling system 100 includes one or more central processing units (CPU) 102, associated memory 104 (for example, random access memory (RAM), read-only memory (ROM), cache memory, flash memory, etc.), a storage device 106 (for example, a hard disk, solid state memory, an optical drive such as a compact disk drive or digital video disk (DVD) drive, a flash memory stick, etc.), and numerous other elements and functionalities typical of today's computers (not shown). The CPU 102 may function to execute program instructions from one or more modules where the program instructions are stored in a memory device such as memory 104 or storage device 106 or any other memory known to one of ordinary skill in the art. The CPU 102 may be configured to execute a controller as contemplated by one or more embodiments of the present invention. The CPU 102 may be a general purpose microprocessor, a microcontroller, a digital signal processor, an application specific integrated circuit (ASIC), a field programmable gate array (FPGA), a programmable logic device, a controller, a state machine, a gated logic, discrete hardware components, an artificial neural network, or any like suitable hardware known to one of ordinary skill in the art that can perform calculations of other manipulations of data according to the present invention. The information handling system 100 may also include an I/O interface 108 for sending and/or receiving inputs, such as inputs from a keyboard, a mouse, or a microphone. I/O interface 108 may also receive information such as multi-dimensional (for example, 3D) geophysical data, one or more values associated with one or more readings, settings, results, variables, feedback (or any other type of data known to one of ordinary skill in the art) from any one or more processes, systems, or external components or any other information known to one of ordinary skill in the art used in systems for model predictive control. For example, in certain embodiments, I/O interface 108 may receive a quality control, level, pressure, temperature or any other reading known to one of ordinary skill in the art from a component within the environment. Further, the information handling system 100 may include output means, such as a display 114 (for example, a liquid crystal display (LCD), a plasma display, or cathode ray tube (CRT) monitor). For example, the controller may send a notification to the display 114 that a variable has been designated "unavailable" or "available". Display 114 comprises the necessary elements to display any type of data necessary for any of the one or more embodiments of the present invention.

The information handling system 100 may be connected to a network 116 (for example, a local area network (LAN), a wide area network (WAN) such as the Internet, or any other similar type of network) via a network interface connection 110 to receive data from sensors, measurements, readings or any other data known to one of ordinary skill in the art as required by any one or more embodiments of the present invention. Those skilled in the art will appreciate that many different types of information handling systems exist, and the aforementioned input and output means may take other forms. Generally speaking, the information handling system 100 includes at least the minimal processing, input, and/or output devices, whether hardware, software or any combination thereof, necessary to practice embodiments of the invention.

The CPU 102 of information handling system 100 may also execute one or more applications 118. Application 118 may include one or more processors (not shown), for example, an estimator and a controller. a controller refers to a multivariable MPC application designed to perform advanced process control (APC). An estimator refers to a computational based predictive application designed to perform measurement estimation. A CPU, such as CPU 102, may execute instructions for many functions, including I/O communications, variable and measurement validation, estimation and prediction, steady-state optimization, and control move calculation. Application 118 may contain its own estimation function, but has parameters available for interface and collaboration with other processing units including CPU 102. Example parameters may include estimated value, maximum estimation value, minim estimation value, and other parameters known to one of ordinary skill in the art.

Any one or more processors, controllers and estimators, associated with application 118 may also be associated with one or more predictive models or computational algorithms, which themselves may contain lists of input and output variables, and also include tuning and other design and configuration information.

In the specification and in the claims the term 'manipulated variable' (MV) is used to refer to variables that can be manipulated by the application 118, and the term 'controlled variable' (CV) is used to refer to a variable that has to be kept by the advanced process controller at a predetermined value (set point) or within a predetermined range (set range). The term 'disturbance variable' (DV) is used to refer to non-MV inputs to the controller or estimator. The term 'intermediate variable' (IV) is used to refer to process output variables (POV) whose predicted values may be used to improve the estimation of their, related POVs (which are typically "downstream" and equally or more slowly time responding). The expression "variable sets" is used to refer to a defined group of variables used by a given model. A given model may have many variable sets and any variable may be a member of a variable set. The expression 'optimizing a variable' is used to refer to maximizing or minimizing the variable and to maintaining the variable at a predetermined value. The term POV relates to a variable whose value is changed by changes in the process inputs. The expression "real-time optimization" is used to refer to the adjustment of variable values or processing parameters so as to achieve an economic, reliability, performance, or other operational benefit.

Variables in application 118 can be further classified based on their structural relationship to the process. Process inputs are variables whose value changes may be independently used to estimate changes in the process outputs. Process inputs are conventionally known to one of ordinary skill in the art to include MVs (independent process settings which will be adjusted by the controller) or as DVs (independent process settings which will not be adjusted by the controller and which are not affected by changes in the MVs). POVs are real or potential process measurements whose value is directly related to the engineering phenomena of the manufacturing process (for example, temperatures, pressures, and compositions), and are most commonly known to one of ordinary skill in the art to be determined by the values of the process inputs. Variable Sets provide for grouping variables for display and for transactional control (for example, changing modes).

A user may be any operator, technician, or engineer in communication with or interacting with one or more information handling systems 100, or any other user known to one of ordinary skill in the art.

Further, those skilled in the art will appreciate that one or more elements of the aforementioned information handling system 100 may be located at a remote location and connected to one or more other elements over a network. Further, embodiments of the invention may be implemented on a distributed system having a plurality of nodes, where each portion of the invention may be located on a different node within the distributed system. For example, the display 114 may be located remotely from the other components of the information handling system 100. Information handling system 100 may comprise one or more client devices, servers, or any combination thereof.

Figure 2:
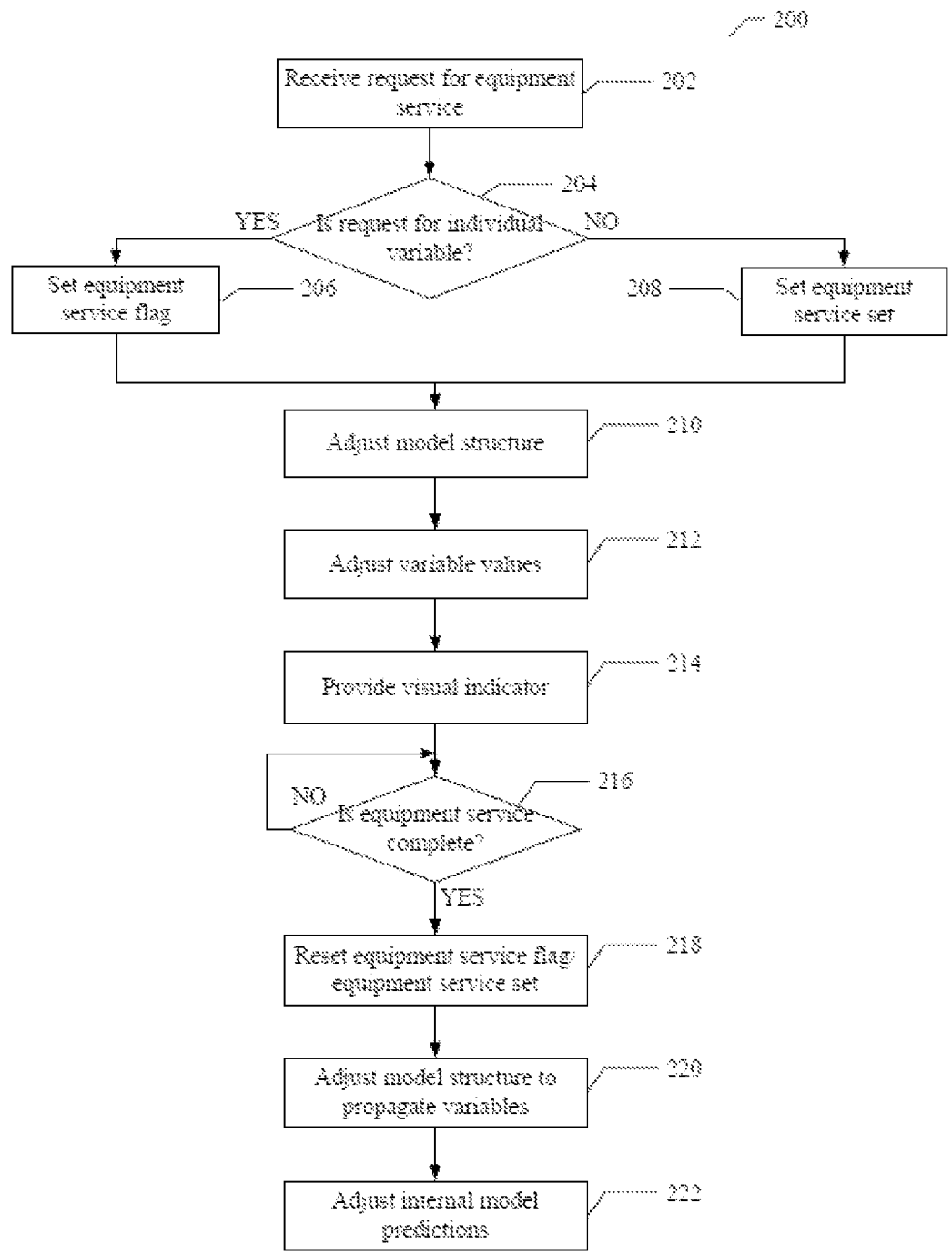
FIG. 2 flow diagram is a flowchart according to one or more embodiments of the present disclosure for handling equipment service changes for model predictive controllers and estimators.
Figure 3:
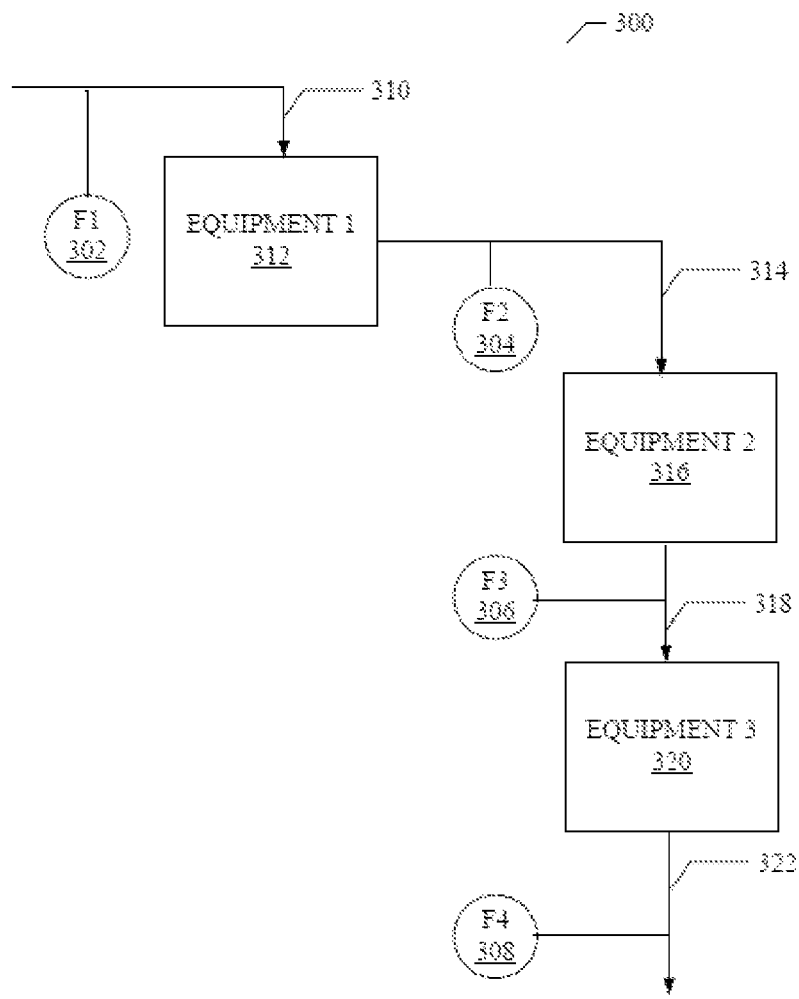
FIG. 3 shows an example system according to one or more embodiments of the present disclosure.

Referring to FIG. 2, depicted generally at 200 is a flow diagram for handling equipment service changes for a model predictive estimator or controller to reduce downtime and potential control designer errors in a system that includes multiple components or equipment. For example, in one embodiment, a system may include several components or equipment where variables from one component feed into another component as shown generally at 300 in FIG. 3. In one embodiment, Equipment 1 312 may have as an input stream 310 with associated measurement variable F1 302, with output stream 314 and its associated measurement F2 304, and further acting as an input to Equipment 2 316, with output stream 318 and its associated measurement F3 306, which is further acting as an input to Equipment 3 320, with output stream 322 and its associated measurement F4 308. The associated measurements being, for example, level, temperature, pressure, quality, or other potentially measureable engineering values known to one of ordinary skill in the art.

For modeling purposes the value of F1 302 may be used to derive the current and future values of variable F2 304, which themselves may be used to derive the current and future values of F3 306. Further, the current and future values of variable F3 306 may be used to derive the current and future values of F4 308. When Equipment 1 312 is placed out-of-service, the properties of stream 314 change such that F2 304 no longer properly provides a value which should be used to derive F3 306. However, other modeling relationships, for example, relationships that use F3 306, being used to derive F4 308 are maintained. While only three equipment components are shown, Equipment 1 302, Equipment 2 306, Equipment 3 308 and any number of other equipment components may be used.

In one or more embodiments, equipment components may be full or partial portions of physical process equipment, or more generally individual engineering phenomena separated for modeling purposes. Additionally, components and streams may include one or more variables with complex modeling relationships to downstream components. Complex modeling relationships include linear and non-linear terms, statistical and empirical models, open and closed equation forms, first principle and correlation models and other forms known to one of ordinary skill in the art. Several embodiments that include, for example, placing a component in service, changing the properties of a component stream, and changes in operating conditions are likewise applicable. Likewise, any one or more equipment components may have one or more input variables (including other input variables not included in a service status change) and one or more outputs (including other output variables not included in a service status change) with these inputs and outputs feeding into one or more equipment components.

In one embodiment shown generally at 200 of FIG. 2, a request for a change in equipment service is received at step 202. The request may be triggered by a user transaction, values received from an I/O Interface, inputs/output from another program or application, or any other triggers known to one of ordinary skill in the art. The received request may be for an individual variable or for a group of variables. A group of variables may contain two or more variables, and the set may be constructed specifically by a user or designer to handle identified process conditions, or automatically by a system based on other available model and application configuration information. An individual variable may be requested when the operating conditions warrant consideration of model changes for only a single variable; for example, when the components of a process stream change such that an analyzer will not be providing process values applicable to downstream variables. A group of variables may be requested when the operating conditions warrant consideration of several model changes related to several variables, all of which may be associated with a piece of equipment that is being placed out-of-service. For example, when a heat exchanger is placed out-of-service, outlet temperatures on both sides of the exchanger may not be providing process values applicable to a variety of downstream variables.

At step 204 the type of request is determined. That is, if it is determined at step 204 that the equipment service is for an individual variable, then at step 206 the equipment service flag corresponding to the individual variable is adjusted to indicate that the variable is in equipment service mode and an adjustment to the model must be made. The equipment service flag may be a single bit or multiple bits stored in any memory including memory 104, storage device 106, memory associate with CPU 102, or any other memory known to one of ordinary skill in the art. If it is determined at step 204 that equipment service is for a group of variables, then at step 208 the equipment service flag for all the variables associated with the set are likewise adjusted, indicating multiple adjustments to the model must be made. The equipment service set flag may be associated with a single bit or multiple bits stored in any memory including memory 104, storage device 106, memory associate with CPU 102, or any other memory known to one of ordinary skill in the art. When the equipment service flag is set for any variable, whether an individual variables or a group of variables, value changes may not be propagated for prediction update.

Once the equipment service flag is set in step 206 or multiple flags are set in step 208, the model structure is appropriately adjusted in step 210, which may include for example setting modeling coefficients to zero to remove process relationships which would otherwise exist, and/or adjustment of coefficients for more complex modeled process relationships known to one of ordinary skill in the art. Structural adjustments may be made, at least in part, for prediction purposes, the calibration of associated POV process measurements, process POV estimation and future prediction, determination of MV control adjustments, determination of feasible MV and CV control target values, and optimization of the process. Setting the equipment service flag in step 206 or step 208 indicates that the particular individual variables or set of group of variables no longer provide a propagating connection the model process. For example, in a system with a column, heat exchanger, and reactor in series, when the heat exchanger variables are placed in equipment service (associated equipment service flags are set) model process effects from the column through the exchanger to the reactor are no longer connected in the model. For the purposes of disturbance estimation and prediction propagation, the values of the exchanger MVs, DVs and POVs are held constant (produce no changes to produce an effect), even though they may continue to be measured and individually predicted. The model structure provides the functionality required for estimation and control and may be based, at least in part, on prior knowledge or correlation data associated with the system to be modeled. The model structure may be provided by a user.

In addition to modeling adjustments, variable or signal adjustments in step 212 may also need to be made to ensure modeling consistency and proper consideration of the indicated equipment service. These adjustments may be as simple as holding the variable constant, or may be otherwise determined by the type and structure of model constructed in the application 118, with the appropriate adjustments for the particular configuration well known to one of ordinary skill in the art. For example, in one embodiment a system includes a column, heat exchanger, and reactor placed in series with each other. When the heat exchanger variables are placed in equipment service, modeled process effects from the column through the exchanger to the reactor are no longer connected in the model, and any input effects from column in the reactor model are held constant or otherwise estimated.

The values adjusted at step 212, may include past, current and predicted future values, and may depend on the nature of the model used and the projected process effects of the equipment service indicated. For example, when a simple linear time series model is used, any inputs associated with the values of the individual variable or the group of variables placed in equipment service and used by the downstream models may be based, at least in part, on a constant value.

Next, at step 214, a visual indicator or flags may be provided that identify which of one or more variable or groupings of variables or portions of the model are currently in an equipment service mode, such that their modeled process effect is being otherwise adjusted. That is, an identification may be provided via display 114 that indicates when an individual variable or a group of variables associated with an equipment service set have been placed in equipment service mode.

At step 216, it is determined whether the equipment service is complete. Step 216 is repeated until the equipment service is complete, the system or equipment is ready to be adjusted back to its normal state, for example, placed back online. If it is determined that the equipment service is complete, at step 218 the equipment service flags are reset or the equipment service flags adjusted. As the equipment is no longer under service, at step 220, the model is appropriately reset or adjusted back to its normal condition, other internal flags set, and for example, the individual variable or group of variables.

At step 222 the internal model predictions are adjusted to reconnect the one or more variable values. Proper consideration is made for appropriate "reconnection" of measurement and prediction values when equipment service flags are changed. For example, this includes compensation for model values which were held constant but may have an actual process change during the equipment service condition, reset of the estimation calibration process and general initialization of control and optimization values known to one of ordinary skill in the art.

While the embodiments are described with references to various implementations and exploitations, it will be understood that these embodiments are illustrative and that the scope of the inventive subject matter is not limited to them. Many variations, modifications, additions, and improvements are possible.

Plural instances may be provided for components, operations or structures described herein as a single instance. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

That which is claimed is:

1. A method for handling equipment service flags, comprising steps of:
receiving a request for service of one or more equipment components;
determining type of request, wherein the type of request comprises equipment service for one or more variables;
setting one or more flags associated with the one or more variables to indicate that said one or more variables are in equipment service mode such that value changes in said one or more variables do not propagate from prediction update;
adjusting the one or more variables;
adjusting a model structure comprising: setting modeling coefficients to zero to remove process relationships and/or adjusting coefficients for more complex modeled process relationships;
determining if equipment service is completed;
resetting the one or more flags if it is determined that the equipment service is complete;
readjusting the model structure to propagate the one or more variables; and
adjusting one or more internal model predictions to reconnect the one or more variable values.

2. The method of claim 1, wherein the one or more variables comprises at least one of an individual variable and a group of variables.

3. The method of claim 1, wherein the adjustment of the model structure is made, at least in part, for at least one of prediction purposes, calibration of associated process output variable (POV) process measurements, process POV estimation and future prediction, determination of a manipulated variable control adjustments, determination of feasible manipulated variable and control variable target values, and optimization of a process.

4. The method of claim 1, wherein a visual indicator identifies the one or more variables that are currently in an equipment service mode.

5. The method of claim 1, wherein the request is received at an estimator or controller.

6. The method of claim 1, wherein one or more complex modeling relationships are associated with the one or more equipment components.

7. A system comprising:
one or more processors for processing information;
a memory communicatively coupled to the one or more processors; and
one or more modules that comprise instructions stored in the memory, the instructions, when executed by the processor, operable to perform operations comprising:
receiving a request for service of one or more equipment components;
determining type of request, wherein the type of request comprises equipment service for one or more variables;
setting one or more flags associated with the one or more variables to indicate that said one or more variables are in equipment service mode such that value changes in said one or more variables do not propagate for prediction update;
adjusting the one or more variables;
adjusting a model structure, comprising: setting modeling coefficients to zero to remove process relationships and/or adjusting coefficients for more complex modeled process relationships;
determining if equipment service completed;
resetting the one or more flags if it is determined that the equipment service is complete;
readjusting the model structure to propagate the one or more variables; and
adjusting one or more internal model predictions to reconnect the one or more variable values.

8. The system of claim 7, wherein the one or more variables comprises at least one of an individual variable and a group of variables.

9. The system of claim 7, wherein the adjustment of the model structure is made, at least in part, for at least one of prediction purposes, calibration of associated process output variable (POV) process measurements, process POV estimation and future prediction, determination of a manipulated variable control adjustments, determination of feasible manipulated variable and control variable target values, and optimization of a process.

10. The system of claim 7, wherein a visual indicator identifies the one or more variables that are currently in an equipment service mode.

11. The system of claim 7, wherein the request is received at an estimator or controller.

12. The system of claim 7, wherein one or more complex modeling relationships are associated with the one or more equipment components.

13. The system of claim 7, wherein one or more input variables not included in a service status change are associated with the one or more equipment components.

* * * * *